US008681510B2

(12) United States Patent
Hu et al.

(10) Patent No.: US 8,681,510 B2
(45) Date of Patent: Mar. 25, 2014

(54) CIRCUIT BOARD

(75) Inventors: Chia-Chan Hu, Taoyuan Hsien (TW); Yuan-Ming Hsu, Taoyuan Hsien (TW)

(73) Assignee: Delta Electronics, Inc., Kuei San, Taoyuan Hsien (TW)

( * ) Notice: Subject to any disclaimer, the term of this patent is extended or adjusted under 35 U.S.C. 154(b) by 287 days.

(21) Appl. No.: 13/007,348

(22) Filed: Jan. 14, 2011

(65) Prior Publication Data

US 2012/0113610 A1 May 10, 2012

(30) Foreign Application Priority Data

Nov. 8, 2010 (TW) ............................... 99138289 A

(51) Int. Cl.
*H05K 7/02* (2006.01)

(52) U.S. Cl.
USPC ........... 361/811; 361/690; 361/719; 361/760; 361/764; 361/783; 174/261; 257/678; 257/698; 439/69; 439/676; 710/104; 710/106; 716/126; 716/137; 333/24 R; 326/30

(58) Field of Classification Search
USPC ................. 361/811, 690, 719, 760, 764, 783; 257/678, 698; 174/261; 439/69, 676; 710/104, 106; 716/126, 137; 333/24 R; 326/30
See application file for complete search history.

(56) References Cited

U.S. PATENT DOCUMENTS

| | | | | |
|---|---|---|---|---|
| 5,603,619 | A * | 2/1997 | Turner et al. | 439/69 |
| 5,815,372 | A * | 9/1998 | Gallas | 361/760 |
| 6,150,724 | A * | 11/2000 | Wenzel et al. | 257/777 |
| 6,172,874 | B1 * | 1/2001 | Bartilson | 361/719 |
| 6,477,592 | B1 * | 11/2002 | Chen et al. | 710/52 |
| 6,662,250 | B1 * | 12/2003 | Peterson | 710/100 |
| 6,998,870 | B1 * | 2/2006 | Gulick et al. | 326/30 |
| 2002/0000797 | A1 * | 1/2002 | Schultz et al. | 323/282 |
| 2003/0106710 | A1 * | 6/2003 | Cheng | 174/261 |
| 2003/0162442 | A1 * | 8/2003 | Panella | 439/608 |
| 2003/0193791 | A1 * | 10/2003 | Panella et al. | 361/764 |
| 2003/0197198 | A1 * | 10/2003 | Panella et al. | 257/200 |
| 2003/0198033 | A1 * | 10/2003 | Panella et al. | 361/760 |
| 2004/0245617 | A1 * | 12/2004 | Damberg et al. | 257/686 |
| 2006/0065963 | A1 * | 3/2006 | Low et al. | 257/686 |
| 2006/0065975 | A1 * | 3/2006 | Mosley et al. | 257/723 |
| 2006/0259889 | A1 * | 11/2006 | Crosetto | 716/10 |
| 2006/0274513 | A1 * | 12/2006 | Panella et al. | 361/783 |
| 2007/0015416 | A1 * | 1/2007 | Gutierrez et al. | 439/676 |
| 2007/0045815 | A1 * | 3/2007 | Urashima et al. | 257/698 |
| 2007/0124532 | A1 * | 5/2007 | Bennett | 711/100 |
| 2007/0138611 | A1 * | 6/2007 | Barbee et al. | 257/678 |
| 2007/0188997 | A1 * | 8/2007 | Hockanson et al. | 361/760 |
| 2007/0263618 | A1 * | 11/2007 | Ornes et al. | 370/386 |
| 2008/0113502 | A1 * | 5/2008 | Low et al. | 438/612 |

(Continued)

FOREIGN PATENT DOCUMENTS

| | | |
|---|---|---|
| CN | 2512114 Y | 9/2002 |

*Primary Examiner* — Xiaoliang Chen
(74) *Attorney, Agent, or Firm* — Muncy, Geissler, Olds & Lowe, P.C.

(57) ABSTRACT

A circuit board includes a first circuit area, a first processing unit and a conductive pattern. The first circuit area includes a plurality of first electrically contacts. The first processing unit, which includes a ball grid array (BGA) substrate, is disposed on the first circuit area and is electrically connected to the first electrically contacts. The BGA substrate has a plurality of solder balls and a bypass circuit. The conductive pattern is electrically connected to the first electrically contacts.

5 Claims, 4 Drawing Sheets

(56) References Cited

U.S. PATENT DOCUMENTS

2008/0178139 A1* 7/2008 Pfeil et al. ........................ 716/15
2008/0238583 A1* 10/2008 Shelton et al. .............. 333/24 R
2009/0216924 A1* 8/2009 Bennett .......................... 710/104
2010/0077178 A1* 3/2010 Crosetto .......................... 712/29
2010/0199233 A1* 8/2010 Petunin ............................. 716/1
2011/0010683 A1* 1/2011 Potts et al. .................... 716/126

* cited by examiner

CIRCUIT BOARD

CROSS REFERENCE TO RELATED APPLICATIONS

This Non-provisional application claims priority under 35 U.S.C. §119(a) on Patent Application No(s). 099138289 filed in Taiwan, Republic of China on Nov. 8, 2010, the entire contents of which are hereby incorporated by reference.

BACKGROUND OF THE INVENTION

1. Field of Invention

The present invention relates to a circuit board.

2. Related Art

In the trend of marketing, the suppliers of electronic products usually develop a series of products for satisfying different demands of customers. For different customer markets, the high-level electronic products are configured with high-level signal processing chips for providing a better performance.

For manufacturing different products, the supplier usually selects different circuit boards for the designs of high level products and general products. However, this solution results in waste of development ad research resources and may cause the issues of preparing more components and sorting management. Accordingly, another solution for high level products is disclosed. In this case, a daughter board configured with a high level signal processing chip is separately designed, and then it is connected with a circuit board through a board-to-board connector. Thus, the circuit board can be used in both high level and general products. However, to install the high precise board-to-board connector, the components may be polluted by the solder flux, which can cause the bad connection between the daughter board and the circuit board. Thus, the signal transmission between the daughter board and the circuit board may not normally operate.

Therefore, it is an important subject to provide a circuit board that can be applied to high level and general products and has simplifier manufacturing processes, thereby enhancing the signal transmission quality.

SUMMARY OF THE INVENTION

In view of the foregoing subject, an objective of the present invention is to provide a circuit board that can be applied to high level and general products and has simplifier manufacturing processes, thereby enhancing the signal transmission quality.

To achieve the above objective, the present invention discloses a circuit board including a first circuit area, a first processing unit and a conductive pattern. The first circuit area includes a plurality of first electrically contacts. The first processing unit is disposed on the first circuit area and is electrically connected to the first electrically contacts. The first processing unit includes a ball grid array (BGA) substrate which has a plurality of solder balls and a bypass circuit. The conductive pattern is electrically connected to the first electrically contacts.

In one embodiment of the present invention, the circuit board further includes a second circuit area and a second processing unit. The second circuit area includes a plurality of second electrically contacts electrically connected to the first electrically contacts. The second processing unit is disposed on the second circuit area and electrically connected to the second electrically contacts.

In one embodiment of the present invention, the circuit board further includes a connection unit electrically connected to the conductive pattern.

In addition, to achieve the above objective, the present invention also discloses a circuit board including a first circuit area, a first processing unit and a conductive pattern. The first circuit area includes a plurality of first electrically contacts. The first processing unit is disposed on the first circuit area and is electrically connected to the first electrically contacts. The first processing unit includes a ball grid array (BGA) substrate, which includes a plurality of solder balls and a signal processing element. The conductive pattern is electrically connected to the first electrically contacts.

In one embodiment of the present invention, the circuit board further includes a second circuit area and a second processing unit. The second circuit area includes a plurality of second electrically contacts electrically connected to the first electrically contacts. The second processing unit is disposed on the second circuit area and electrically connected to the second electrically contacts.

In one embodiment of the present invention, the number of the solder balls of the BGA substrate is smaller than the number of the first electrically contacts of the first circuit area.

In one embodiment of the present invention, the circuit board further includes a connection unit electrically connected to the conductive pattern.

As mentioned above, the circuit board of the present invention is configured with a first circuit are, which is served as a reserving area, so that the first processing unit can be additionally installed on the first circuit are based on the product design and requirement. Therefore, the circuit board of the present invention can be applied to both the high level and general products, and its manufacturing processes can be simplified, thereby enhancing the signal transmission quality.

BRIEF DESCRIPTION OF THE DRAWINGS

The present invention will become more fully understood from the subsequent detailed description and accompanying drawings, which are given by way of illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 1:
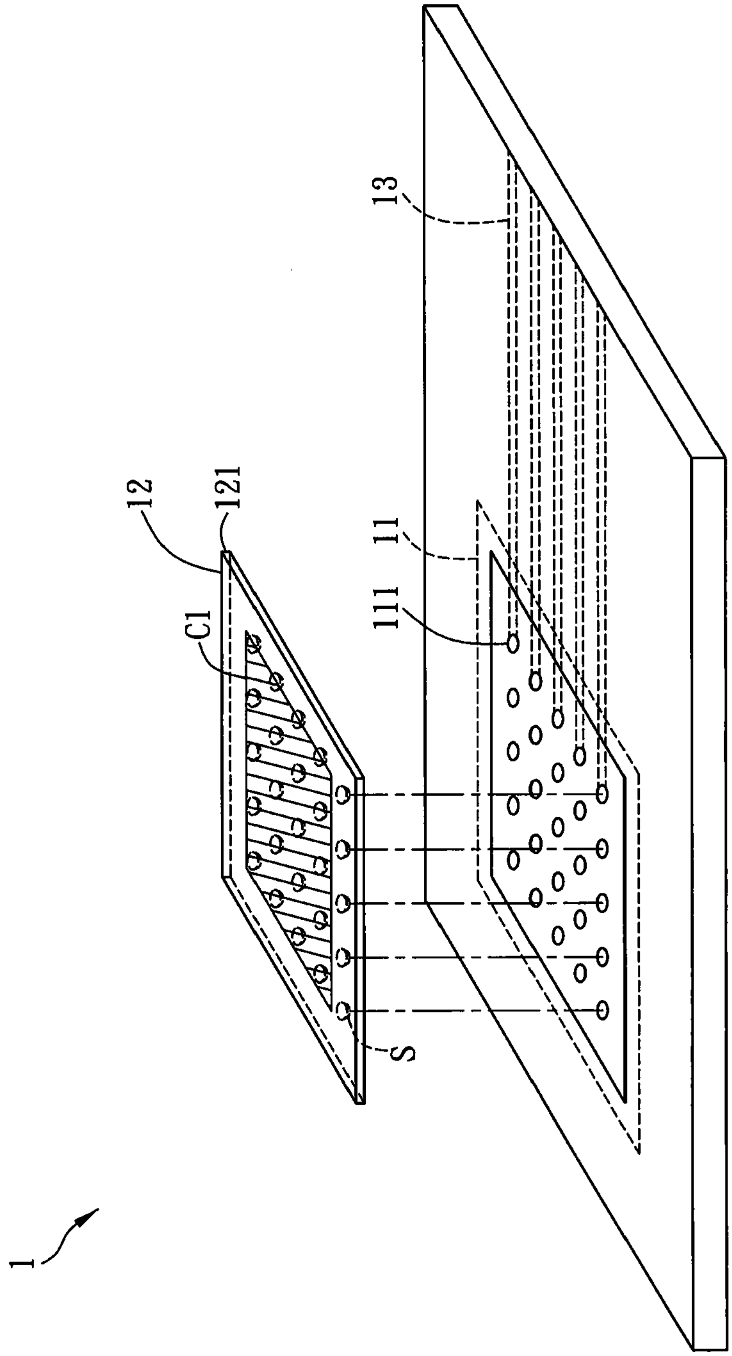
FIG. 1 is a schematic diagram of a circuit board according to a preferred embodiment of the invention.

FIG. 1 is a schematic diagram of a circuit board 1 according to a preferred embodiment of the invention. Referring to FIG. 1, the circuit board 1 includes a first circuit area 11, a first processing unit 12, and a conductive pattern 13. The circuit board 1 is installed in an electronic device such as a computer system, a video player, a portable electronic product or a detecting apparatus. To be noted, the invention is not to limit the application scope of the circuit board 1. In addition, the circuit board 1 can be a single-sided circuit board, a double-sided circuit board, or a multilayer circuit board.

The first circuit area 11 is located on a surface of the circuit board 1 and includes a plurality of first electrically contacts 111. In practice, the first electrically contacts 111 are solder bumps. The first processing unit 12 includes a ball grid array (BGA) substrate 121. In this embodiment, a surface of the BGA substrate 121 is configured with a plurality of solder balls S, which are arranged in ball grid array, and the other surface of the BGA substrate 121 is configured with a bypass circuit C1. The specification and dimension of the solder balls S are corresponding to the first electrically contacts 111. The first processing unit 12 is disposed on the first circuit area 11, and is electrically connected to the first electrically contacts 111 through the solder balls S. The conductive pattern 13 is electrically connected to the first electrically contacts 111 of the first circuit area 11.

Figure 2:
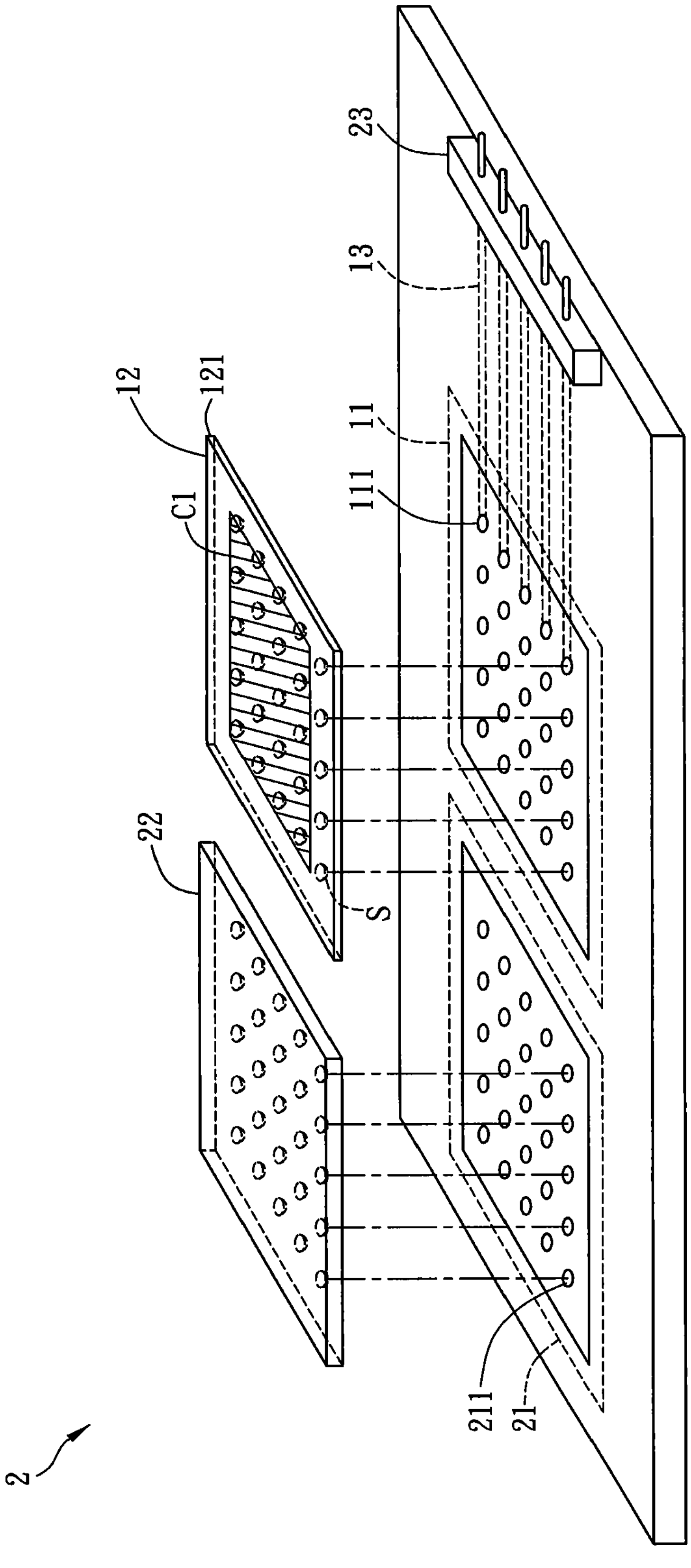
FIG. 2 is a schematic diagram of another circuit board according to the preferred embodiment of the invention.

In addition, FIG. 2 is a schematic diagram of another circuit board 2 according to the preferred embodiment of the invention. With reference to FIG. 2, the difference between the circuit board 2 and the above-mentioned circuit board 1 is in that the circuit board 2 further includes a second circuit area 21, a second processing unit 22, and a connection unit 23.

In this embodiment, the second circuit area 21 includes a plurality of second electrically contacts 211 electrically connected to the first electrically contacts 111 of the first circuit area 11. The second processing unit 22 is disposed on the second circuit area 21 and electrically connected to the second electrically contacts 211. Herein, the second processing unit 22 is a video processor.

The connection unit 23 is electrically connected to the conductive pattern 13, and the circuit board 2 can be electrically connected with other components through the connection unit 23. In practice, the connection unit 23 is an edge card connector, a golden finger connecting interface, a board-to-board connector, or a flexible flat cable connector.

When the circuit board 1 or 2 is used as the main board of a normal electronic device, the first circuit area 11 is disposed with the first processing unit 12, so that the signals can be transmitted to other components through the bypass circuit of the first processing unit 12. Alternatively, when the circuit board 1 or 2 is used a the main board of a high level electronic device, the first circuit area 11 is disposed with a high level processing unit for providing a better processing performance.

Based on the above-mentioned hardware structure, the circuit board of the present invention is configured with the first circuit are and the bypass circuit or various kinds of processing units, so that it can be applied to both high level and general products. In addition, the processing unit and the circuit area of the present invention are connected through the BGA connection, so that the signal transmission quality can be enhanced.

Figure 3:
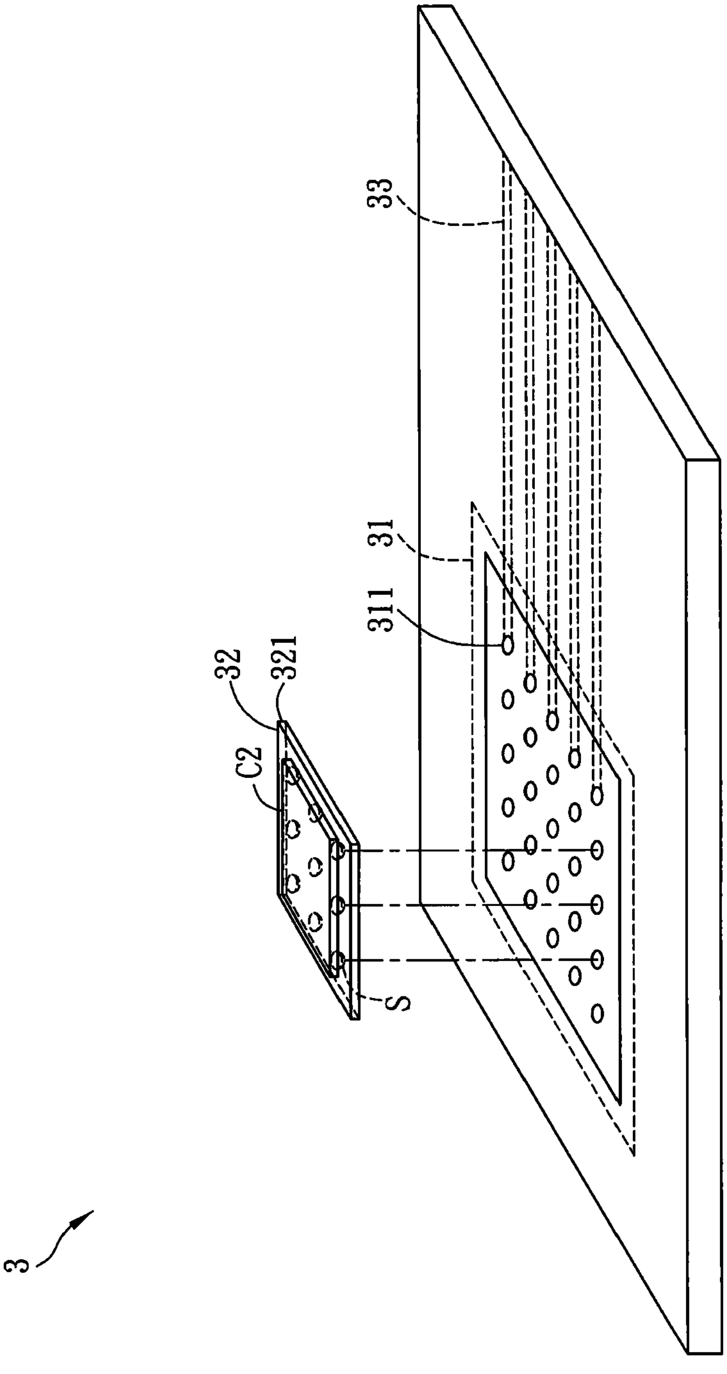
FIG. 3 is a schematic diagram of another circuit board according to the preferred embodiment of the invention.

In addition, FIG. 3 is a schematic diagram of another circuit board 3 according to the preferred embodiment of the invention. With reference to FIG. 3, the circuit board 3 includes a first circuit area 31, a first processing unit 32, and a conductive pattern 33. The first circuit area 31 is disposed on a surface of the circuit board 3, and includes a plurality of first electrically contacts 311. In practice, the first electrically contacts 311 are solder balls.

The first processing unit 32 includes a BGA substrate 321. In this embodiment, a surface of the BGA substrate 321 is configured with a plurality of solder balls S, which are arranged in ball grid array, and the other surface of the BGA substrate 321 is configured with a signal processing element C2. The first processing unit 32 is disposed on the first circuit area 31, and is electrically connected to the first electrically contacts 311 through the solder balls S. The conductive pattern 33 is electrically connected to the first electrically contacts 311 of the first circuit area 31.

In practice, there are various kinds of dimensions and packages for the signal processing units, which can provide different specific functions and supports. In order to be applied to both high level and general products, the first electrically contacts 311 of the first circuit area 31 of the circuit board 3 is designed based on the pins of the processing unit with larger dimension. Therefore, the BGA substrate 321 of the first processing unit 32 can be configured with the corresponding solder balls S and circuit layout according to the first electrically contacts 311. Consequently, it is possible to mount different dimensions of signal processing element C2 on the BGA substrate 321.

In this embodiment, the dimension of the first processing unit 32 is smaller than that of the first circuit area 31, and the number of the solder balls S of the BGA substrate 321 is smaller than that of the first electrically contacts 311 of the first circuit area 31. Based on the above-mentioned hardware structure, the circuit board of the present invention is configured with the first circuit are and the first processing unit 32, which can be different kinds of specifications and dimensions, so that it can be applied to both high level and general products.

Figure 4:
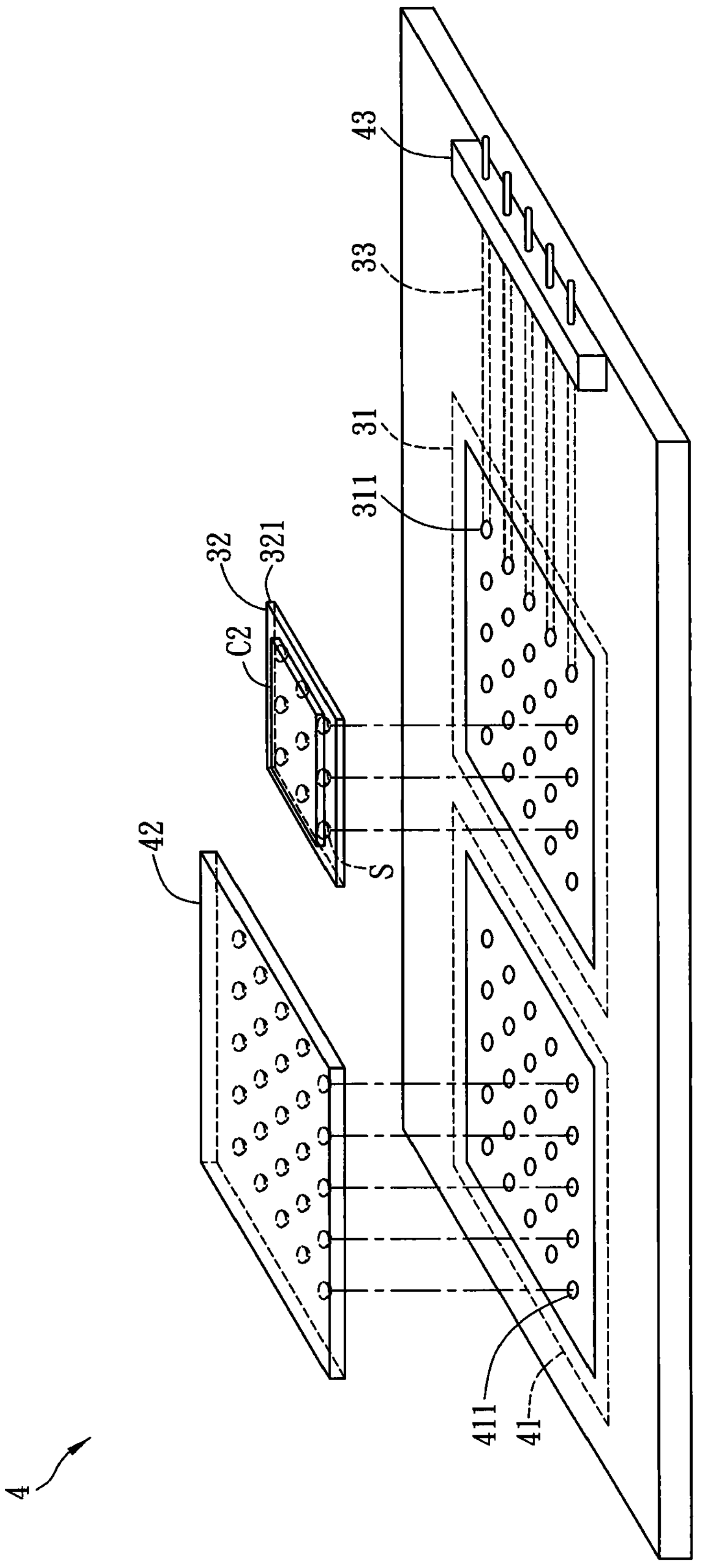
FIG. 4 is a schematic diagram of another circuit board according to the preferred embodiment of the invention.

In addition, FIG. 4 is a schematic diagram of another circuit board 4 according to the preferred embodiment of the invention. With reference to FIG. 4, the difference between the circuit board 4 and the above-mentioned circuit board 3 is in that the circuit board 4 further includes a second circuit area 41, a second processing unit 42, and a connection unit 43.

In this embodiment, the second circuit area 41 includes a plurality of second electrically contacts 411 electrically connected to the first electrically contacts 311 of the first circuit area 31. The second processing unit 42 is disposed on the second circuit area 41 and electrically connected to the second electrically contacts 411.

The connection unit 43 is electrically connected to the conductive pattern 33. In practice, the connection unit 43 is an edge card connector, a golden finger connecting interface, a board-to-board connector, or a flexible flat cable connector.

In summary, the circuit board of the present invention is configured with a first circuit are, which is served as a reserving area, so that the first processing unit can be additionally installed on the first circuit are based on the product design and requirement. Therefore, the circuit board of the present invention can be applied to both the high level and general products, and its manufacturing processes can be simplified, thereby enhancing the signal transmission quality.

Although the present invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the present invention.

What is claimed is:

1. A circuit board comprising:

a first circuit area comprising a plurality of first electrical contacts;

a first processing unit comprising a ball grid array (BGA) substrate, the BGA substrate having a plurality of solder balls, wherein the first processing unit is disposed on the first circuit area and is electrically connected to the first electrical contacts;

a conductive pattern electrically connected to the first electrical contacts;

a second circuit area comprising a plurality of second electrical contacts, wherein the second electrical contacts are electrically connected to the first electrical contacts; and a second processing unit disposed on the second circuit area and electrically connected to the second electrical contacts;

wherein the BGA substrate further comprises a bypass circuit or a signal processing element, when the BGA substrate comprises the bypass circuit, the second processing unit is electrically connected to the bypass circuit via the second electrical contacts and the first electrical contacts, and a signal from the second processing unit is transmitted through the bypass circuit of the first processing unit, when the BGA substrate comprises the signal processing element, the second processing unit is electrically connected to the signal processing element via the second electrical contacts and the first electrical contacts, and the signal processing element is configured with the second processing unit.

2. The circuit board according to claim 1, wherein the second processing unit is a video processor.

3. The circuit board according to claim 1, further comprising:

a connection unit electrically connected to the conductive pattern.

4. The circuit board according to claim 3, wherein the connection unit is an edge card connector, a golden finger connecting interface, a board-to-board connector, or a flexible flat cable connector.

5. The circuit board according to claim 1, wherein the number of the solder balls of the BGA substrate is less than the number of the first electrically contacts of the first circuit area.

* * * * *